United States Patent
Wagh

(10) Patent No.: US 7,612,696 B2
(45) Date of Patent: Nov. 3, 2009

(54) METHOD AND SYSTEM FOR DECIMATING A PULSE WIDTH MODULATED (PWM) SIGNAL

(75) Inventor: Poojan A. Wagh, Sleepy Hollow, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 12/057,658

(22) Filed: Mar. 28, 2008

(65) Prior Publication Data

US 2009/0243908 A1 Oct. 1, 2009

(51) Int. Cl.
*H03M 5/08* (2006.01)
(52) U.S. Cl. .......................................... 341/53; 341/50
(58) Field of Classification Search .................. 341/50, 341/53, 68, 61, 51, 52
See application file for complete search history.

(56) References Cited

U.S. PATENT DOCUMENTS

| | | | |
|---|---|---|---|
| 5,515,402 A * | 5/1996 | Chester | 375/350 |
| 6,549,859 B1 * | 4/2003 | Ward | 702/66 |
| 6,606,044 B2 * | 8/2003 | Roeckner et al. | 341/143 |
| 6,664,908 B2 * | 12/2003 | Sundquist et al. | 341/143 |
| 6,965,339 B2 | 11/2005 | Midya et al. | |
| 6,992,604 B2 * | 1/2006 | Miller et al. | 341/61 |
| 6,993,097 B2 * | 1/2006 | Hammes et al. | 375/334 |
| 7,498,957 B2 * | 3/2009 | De Buys | 341/61 |
| 2004/0120361 A1 | 6/2004 | Yu et al. | |
| 2005/0047404 A1 * | 3/2005 | Kim et al. | 370/382 |
| 2007/0085717 A1 | 4/2007 | Pedersen et al. | |

* cited by examiner

*Primary Examiner*—Brian Young

(57) ABSTRACT

A method and system of decimating a Pulse Width Modulated (PWM) signal (537) is provided. The method includes computing one or more timestamps (553) of the PWM signal (537), the PWM signal being at a first sample rate (567). The one or more timestamps (553) are computed at a second sample rate (568), which is lower than the first sample rate (567). Thereafter, the method generates a plurality of pre-filter signals (557-*n*) based on each of the one or more timestamps (553) and a plurality of translation factors (555-*n*). The plurality of pre-filter signals (557-*n*) is then filtered at the second sample rate (568) using a plurality of Infinite Impulse Response (IIR) filters (560-*n*) to generate a plurality of intermediate decimated Pulse Code Modulated (PCM) signals (563). The plurality of intermediate decimated PCM signals (563) is combined to generate a PCM signal (569).

19 Claims, 6 Drawing Sheets

METHOD AND SYSTEM FOR DECIMATING A PULSE WIDTH MODULATED (PWM) SIGNAL

FIELD OF THE INVENTION

The invention relates generally to decimation of a Pulse Width Modulated (PWM) signal. More specifically, the invention relates to a method and system for decimating a PWM signal based on Infinite Impulse Response (IIR) techniques.

BACKGROUND OF THE INVENTION

The electronics industry, as we see today, includes a wide verity of devices which use signal processing in one form or another. Starting from loud speakers, mobile phones to radio transceivers, almost every electronic device involves signal processing. Many of such electronic devices involve conversion of analog signals into digital signals and others involve vice versa. Generally speaking, digital signals are preferred in the electronics industry over the analog signals since a digital signal has a higher margin for error i.e. a digital signal is less error prone. Additionally, a digital signal is well defined and orderly and therefore, it is easier to distinguish from background noise resulting in high quality output from signal processing.

An analog signal may be converted into a digital signal using a process of analog to digital conversion and a device which performs such conversion is called an Analog to Digital Converter (ADC). An ADC converts an analog signal into digital equivalent without altering the information contained in the analog signal. A number of ADCs are available today, among these ADCs a special class of ADC is Pulse Width Modulation Analog to Digital Converter (PWM ADC). A PWM ADC uses Pulse Width Modulation (PWM) techniques for converting an analog signal into a digital signal.

For converting an analog signal into a digital signal, a PWM ADC samples the analog signal at various time instances and obtains a plurality of sample values corresponding to each time instance. The rate of obtaining sample values, i.e. the sample rate, is determined by a decimation clock (RCLK) of the PWM ADC. Thereafter, the sample values are quantized by a quantizer by mapping the sample values to one of a set of discrete quantization levels. The number of quantization levels is determined by a Quantizer clock (QCLK) of the PWM ADC.

It will be apparent that the more the number of quantization levels used, the better the resolution of the digital signal produced. Therefore, the QCLK is kept very high as compared to the RCLK in a PWM ADC. Since the two clocks are separate in a conventional PWM ADC, it is possible to adjust a frequency for each of the RCLK and the QCLK. The two clocks are adjusted in such a way that the ratio of QCLK and RCLK is an integer.

After generation, the PWM signal is decimated using a decimator. Decimation is a process of reducing the number of sample values in a discrete time signal, for instance a PWM signal. A decimator generates a Pulse Code Modulated (PCM) signal starting from a PWM signal as input. A typical PWM ADC system uses a Finite Impulse Response (FIR) based decimation techniques. Such techniques work well in cases where the QCLK and the RCLK are in an integer relation with each other, i.e., the ratio of QCLK and RCLK is an integer. However, the QCLK and the RCLK may not be in an integer relation with each other for all the cases.

Various cases in decimation of PWM signal may arise in which the relationships between the QCLK and the RCLK may be an integer or a non integer. As an example, a PWM ADC used in Radio transceiver may have a defined RCLK due to the standards specified for a frequency on which the Radio transceiver intends to operate. Further, if a RF oscillator like, Variable Frequency Oscillator (VFO), present in the Radio transceiver is used as the QCLK, the QCLK also becomes extremely defined. Therefore, in such case ratio of the QCLK and the RCLK may not be an integer. Also, in some of the signal processing systems one or more of the QCLK and the RCLK may vary instantaneously which may change the integer relation between QCLK and RCLK.

Some existing methods decimate a PWM signal using FIR based techniques when ratio of the QCLK and the RCLK is not an integer. However, such methods use multiple FIR based decimators for decimation which increases the complexity of system. Also, for implementing such methods, interpolations between multiple decimators may be required. The use of interpolation may result in a loss in accuracy of the PCM signal produced. Other existing methods use Infinite Impulse Response (IIR) techniques for decimation. However, IIR based methods perform decimation by running a decimator at very high sample rates. In the case of a PWM ADC system, a decimator implementing IIR based decimation runs at the QCLK rate. Running the decimator at the QCLK rate makes processing of the PWM signal inefficient since more circuit area and more power is required for processing the PWM signal at a high sample rate.

Therefore, there is a need for a method and system for decimating a PWM signal when the QCLK and the RCLK are not in an integer relationship. There is a further need of a method and system which allows IIR based decimation at a lower sample rate.

BRIEF DESCRIPTION OF THE FIGURES

The accompanying figures where like reference numerals refer to identical or functionally similar elements throughout the separate views and which together with the detailed description below are incorporated in and form part of the specification, serve to further illustrate various embodiments and to explain various principles and advantages all in accordance with the invention.

Figure 1:
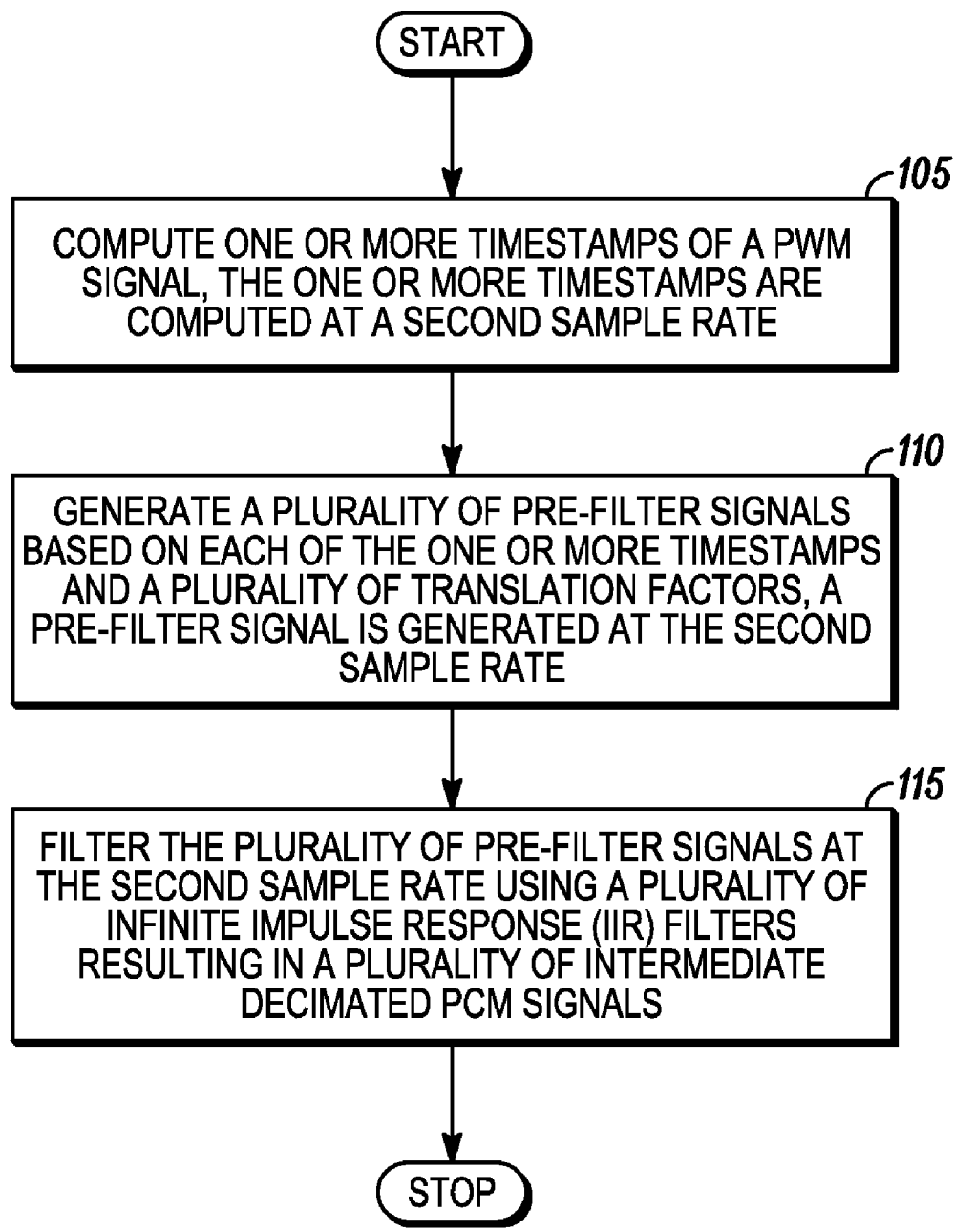
FIG. 1 illustrates a method of decimating a PWM signal in accordance with an embodiment of the invention.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION OF THE INVENTION

Before describing in detail embodiments that are in accordance with the invention, it should be observed that the embodiments reside primarily in combinations of method steps and apparatus components related to a method and system for decimating a Pulse Width Modulated (PWM) signal. Accordingly, the apparatus components and method steps have been represented where appropriate by conventional symbols in the drawings, showing only those specific details that are pertinent to understanding the embodiments of the invention so as not to obscure the disclosure with details that will be readily apparent to those of ordinary skill in the art having the benefit of the description herein.

In this document, relational terms such as first and second, top and bottom, and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "comprises . . . a" does not, without more constraints, preclude the existence of additional identical elements in the process, method, article, or apparatus that comprises the element.

It will be appreciated that embodiments of the invention described herein may be comprised of one or more conventional processors and unique stored program instructions that control the one or more processors to implement, in conjunction with certain non-processor circuits, some, most, or all of the functions of method and system for managing digital to time conversion described herein. The non-processor circuits may include, but are not limited to, a radio receiver, a radio transmitter, signal drivers, clock circuits, power source circuits, and user input devices. As such, these functions may be interpreted as steps of a method for decimating a Pulse Width Modulated (PWM) signal. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used. Thus, methods and means for these functions have been described herein. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

Generally speaking, pursuant to various embodiments, the invention provides a method and system for decimating a Pulse Width Modulated (PWM) signal. According to the method, a plurality of timestamps of the PWM signal is detected. Thereafter, a plurality of pre-filter signals is generated based on each of a plurality of translation factors and the plurality of timestamps. Subsequently, each pre-filter signal is filtered using a corresponding Infinite Impulse Response (IIR) filter to generate a corresponding intermediate decimated PCM signal. Each intermediate decimated PCM signal is then combined to generate a PCM signal.

A Pulse Width Modulation Analog to Digital Converter (PWM ADC) converts an input analog signal into a digital signal using Pulse Width Modulation (PWM) techniques. A PWM ADC utilizes a continuous-time sigma-delta (CTSD) structure with a quantizer. For converting analog signal into a digital signal, a PWM ADC samples the analog signal at various time instances and obtains a sample value for each time instance. The rate of obtaining sample values, i.e. the sample rate, is determined by a decimation clock (RCLK). The sample values obtained are quantized by mapping the sample values to one of a set of discrete quantization levels by the quantizer. The number of quantization levels is determined by a Quantizer clock (QCLK) in the PWM ADC. After generating the PWM signal, a decimator decimates the PWM signal to generate a PCM signal. The PCM signal is a standard binary representation. Any other binary representation of a modulated signal may also be used. As an example, thermometer encoding may be used for representing the decimated signal. In accordance with an embodiment of the invention the technique for decimation is provided.

Referring now to the figures, and in particular FIG. 1, a method of decimating a PWM signal in accordance with an embodiment of the invention is shown. The PWM signal may be generated by a PWM ADC at a first sample rate. At step 105, one or more timestamps of the PWM signal are computed at a second sample rate. The first sample rate is higher than the second sample rate. Consider an exemplary case in which the PWM signal is generated by a PWM ADC, in this case the first sample rate may be determined by the QCLK of the PWM ADC and the second sample rate may be determined by the RCLK of the PWM ADC. As an example, the first sample rate may be equal to the QCLK and the second sample rate may be equal to a multiple of the RCLK.

The one or more timestamps computed at step 105 are at the second sample rate, which is lower than the first sample rate. Therefore, computing of the one or more timestamps represents the information contained in the PWM signal at a lower sample rate (which is equal to the second sample rate). This allows complex processing of the PWM signal using lower power and less circuit area, thereby, increasing the efficiency of signal processing. This is further explained in conjunction with FIG. 2.

After detecting the one or more timestamps, a plurality of pre-filter signals is generated based on each of the one or more timestamps and a plurality of translation factors, at step 110. The plurality of pre-filter signals is generated at the second sample rate. Each translation factor of the plurality of translation factors is based on ratio of the first sample rate and the second sample rate. In an embodiment of the invention, one or more of the plurality of translation factors are exponential translation factors. In an exemplary embodiment, a translation factor can be represented as:

$$Re(e^{(-P_k \times t_r[n])})$$

Wherein, Re( ) extracts the real part and wherein $t_r[n]$ is a time stamp value corresponding to one of a rising edge and a falling edge of the PWM signal and $P_k$ is a desired pole location.

Thereafter, at step 115, the plurality of pre-filter signals is filtered using a plurality of IIR filters to generate a plurality of intermediate decimated PCM signals. An IIR filter of the plurality of IIR filters corresponds to one or more translation factors of the plurality of translation factors. For filtering a pre-filter signal a corresponding IIR filter is used. As an example, consider a pre-filter signal generated based on a first translation factor of the plurality of translation factors, in this case an IIR filer corresponding to the first translation factor is used. Thereafter, the plurality of intermediate decimated PCM signals is combined to produce a PCM signal. In an embodiment of the invention, one or more IIR filters of the plurality of IIR filters are limited to unique poles.

Figure 2:
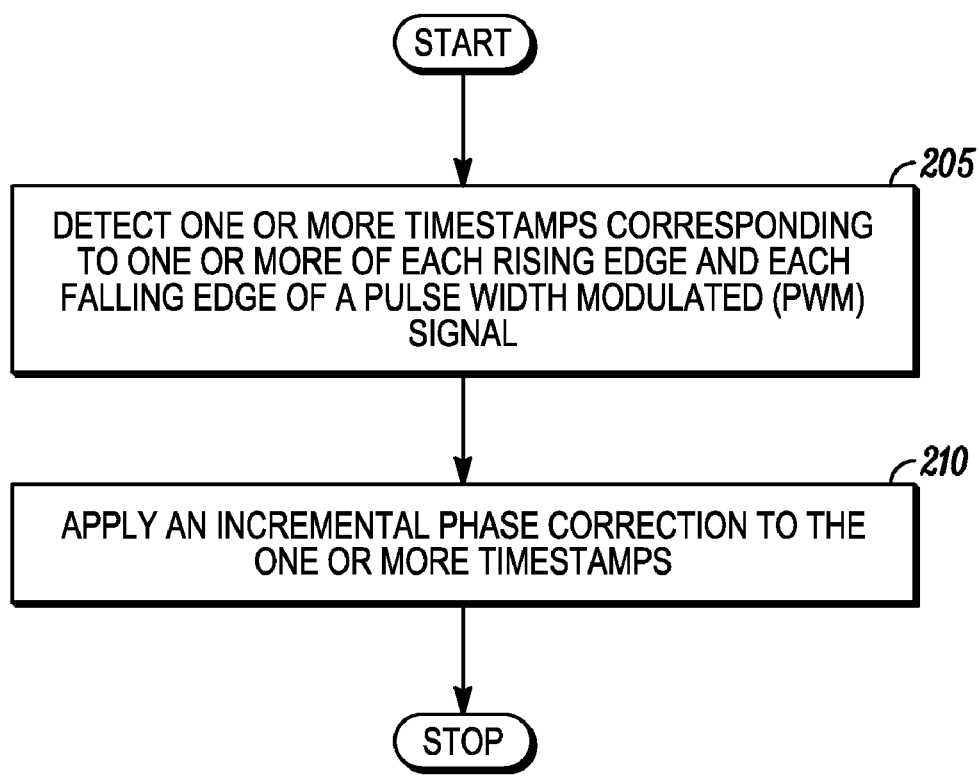
FIG. 2 illustrates a method of computing one or more timestamps of the PWM signal in accordance with an embodiment of the invention.

Referring now to FIG. 2, the method of computing one or more timestamps of the PWM signal is shown. At step 205, one or more timestamps of the PWM signal are detected corresponding to one or more of, each rising edge and each falling edge of the PWM signal. The one or more timestamps are detected at the second sample rate. A timestamp of the one or more timestamps corresponds to one of a rising edge and a falling edge of the PWM signal. The information contained in the PWM signal is represented in the one or more timestamps. The timestamps detected at step 205 may be in terms of a time period of the first sample rate with respect to phase, since the PWM signal is at the first sample rate. Therefore, to represent the one or more timestamps in terms of the time period of the second sample rate, an incremental phase correction may be applied to the one or more timestamps, at step 210. The incremental phase correction is based on a time period of first sample rate and a time period of second sample rate.

The incremental phase correction may not be applied in a scenario when ratio of the first sample rate and the second sample rate is an integer. Since in this scenario the first sample rate and the second sample rate have no phase difference and therefore, no incremental phase correction is required. In another scenario, one or more of the first sample rate and the second sample rate may be instantaneously variable, in this scenario the incremental phase correction is applied only when the ratio of the first sample rate and the second sample rate becomes a non integer.

After applying the incremental phase correction, the one or more timestamps may still be in terms of the time period of the first sample rate. Therefore, the one or more timestamps may be expressed in terms of time period of the second sample rate based on a gain factor after applying the incremental phase correction. The gain factor, in turn, is based on ratio of time period of the first sample rate and time period of the second sample rate. The incremental phase correction and the gain factor convert the timestamps expressed in terms of the first sample rate to the timestamps expressed in terms of the second sample rate. In an embodiment of the invention the one or more timestamps may be expressed in terms of time period of the second sample rate using the gain factor before applying an incremental phase correction.

Figure 3:
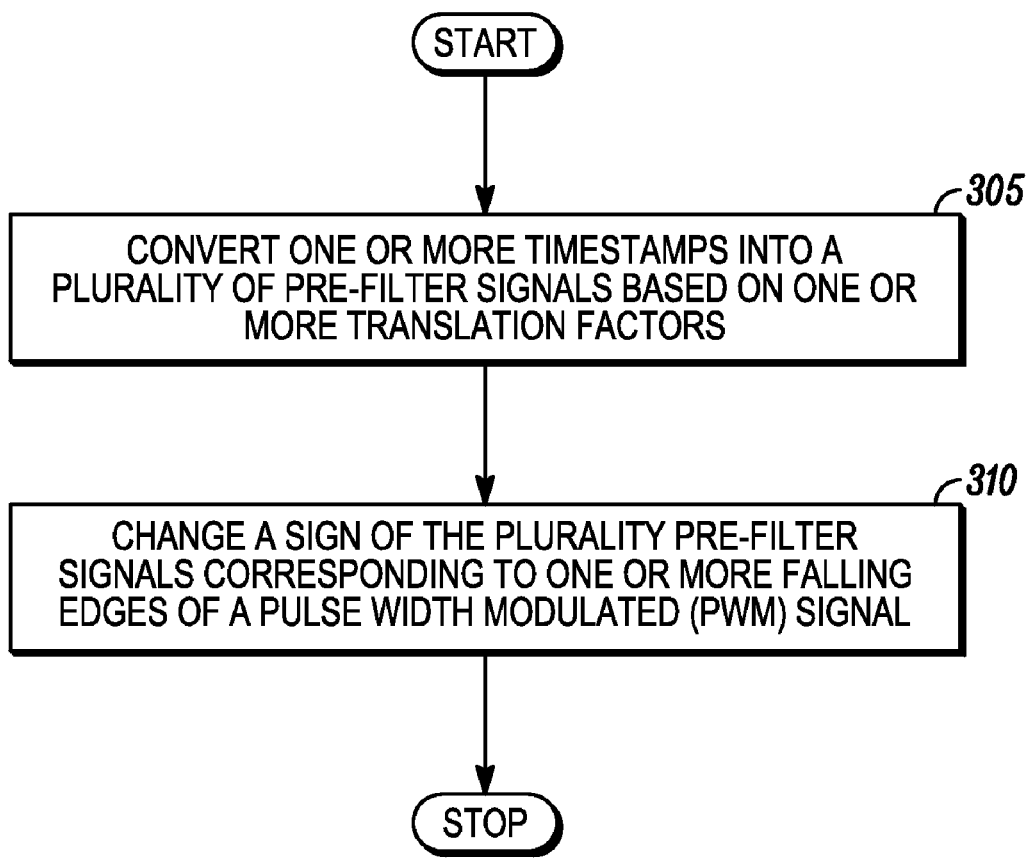
FIG. 3 illustrates a flow diagram for a method of generating a plurality of pre-filter signals in accordance with an embodiment of the invention.

FIG. 3 illustrates a flow diagram for a method of generating a plurality of pre-filter signals in accordance with an embodiment of the invention. At step 305, the one or more timestamps are converted into a plurality of pre-filter signals based on one or more translation factors of the plurality of translation factors. The conversion of the one or more timestamps is performed at the second sample rate. One or more of the plurality of translation factors may be exponential translation factors. In an embodiment of the invention, timestamps corresponding to rising edges of the PWM signal and timestamps corresponding to falling edges of the PWM signal may be converted separately using different circuits based on the one or more translation factors. Alternatively, each of timestamps corresponding to rising edges of the PWM signal and timestamps corresponding to falling edges of the PWM signal may be converted using a single circuit. Processing timestamps using a single circuit helps keeps the circuit area low. This increases the efficiency of signal processing. This is explained in further detail in conjunction with FIG. 4.

The converting step 305, translates the information contained in the PWM signal from timestamp domain into a pre-filter PCM domain which can be filtered to produce an intermediated decimated PCM signal. The timestamps are not filtered directly as this would cause the timestamps to depict a non linear behavior. The translation factors are applied to counteract the non-linear behavior of the timestamps.

A rising edge and a falling edge of the PWM signal have a sign difference in their signal processing. Consequently, a sign of each pre-filter signal of the plurality of pre-filter signals is changed corresponding to each falling edge of the PWM signal, at step 310. Thereafter, as explained in conjunction with FIG. 1, the plurality of pre-filter signals is filtered at the second sample rate using a plurality of IIR filters. Each IIR filter of the plurality of IIR filters corresponds to one or more translation factors of the plurality of translation factors. The filtering results in a plurality of intermediate decimated PCM signals. Finally, the plurality of intermediate decimated PCM signals is combined to produce a PCM signal at the second sample rate.

Figure 4A:
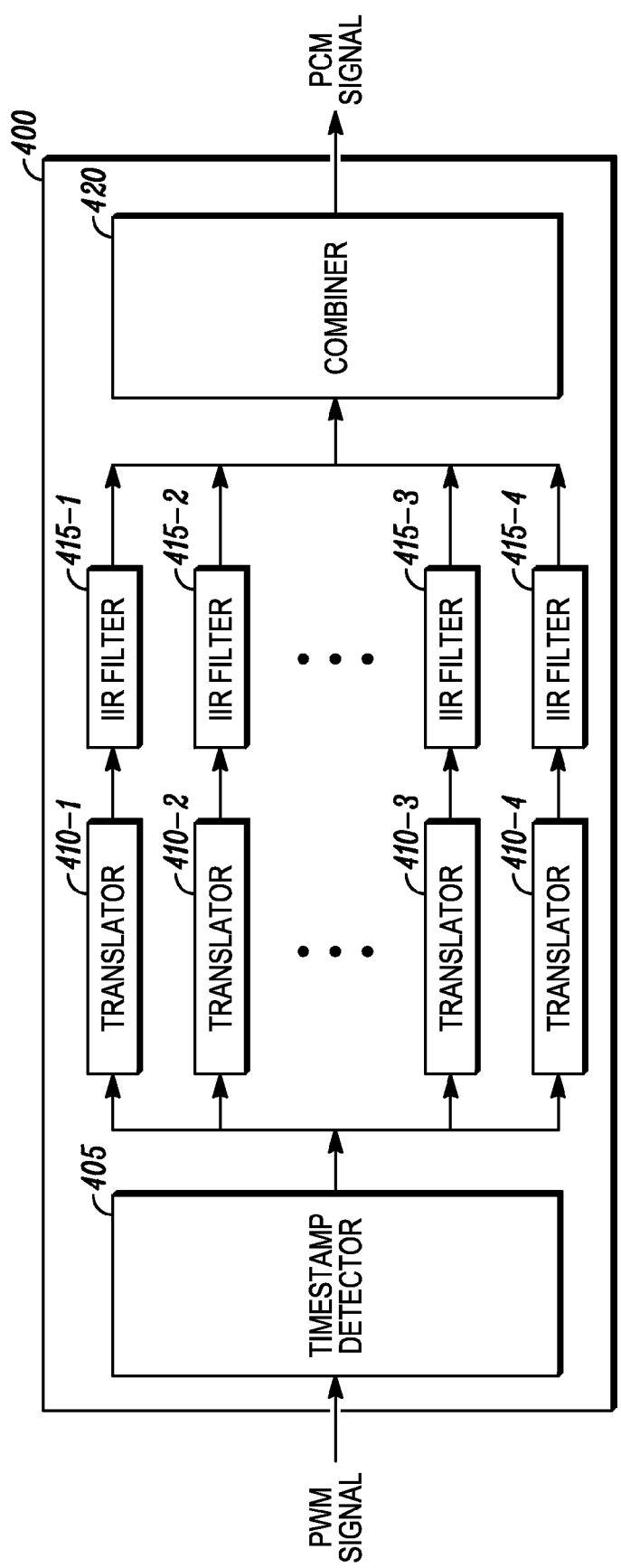
FIG. 4 illustrates a block diagram of a system for decimating a PWM signal in accordance with an embodiment of the invention.
Figure 4B:
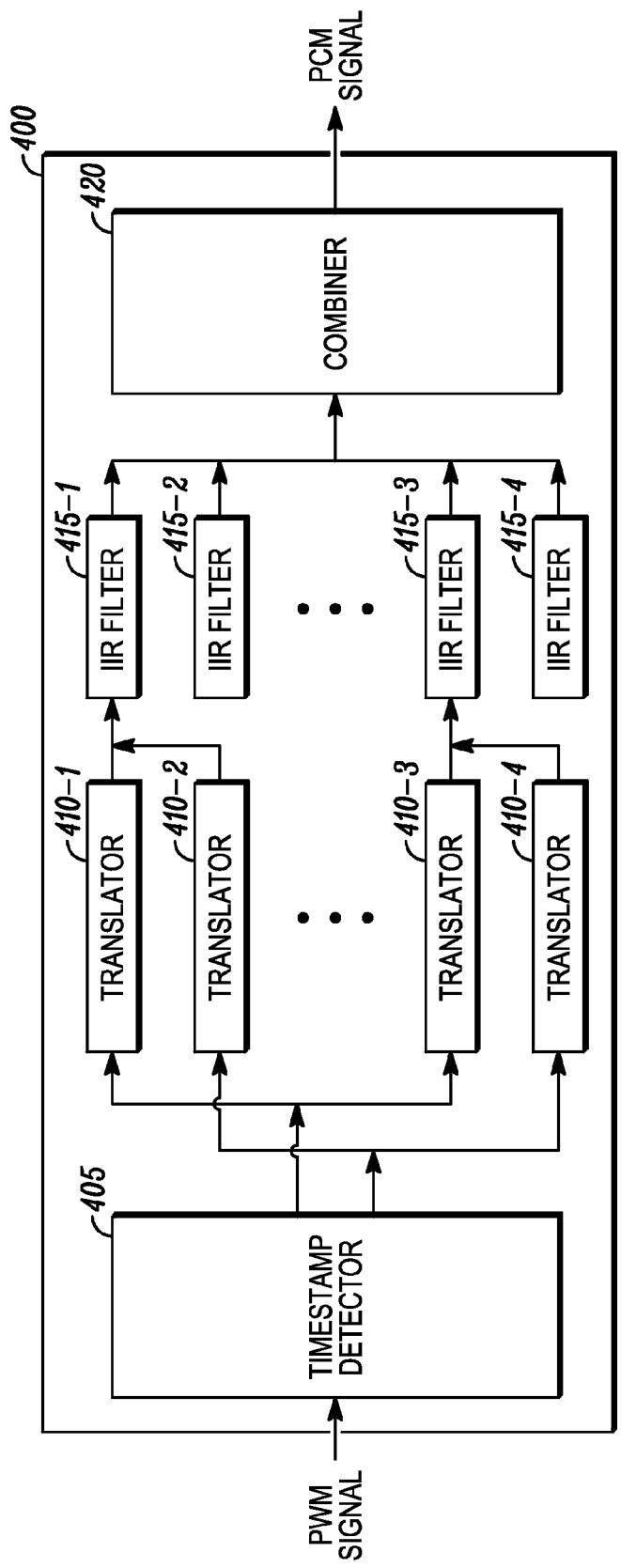

Referring now to FIG. 4 (FIG. 4A and FIG. 4B), a block diagram of a system 400 for decimating a PWM signal in accordance with an embodiment of the invention is shown. The system 400 includes a timestamp detector 405, a plurality of translators 410-$n$, a plurality of IIR filters 415-$n$ and a combiner 420. As illustrated in the FIG. 4, the plurality of translators 410-$n$ includes a translator 410-1, a translator 410-2, a translator 410-3 and a translator 410-4. Also, as illustrated in the FIG. 4, the plurality of IIR filters 415-$n$ includes an IIR filter 415-1, an IIR filter 415-2, an IIR filter 415-3 and an IIR filter 415-4.

The timestamp detector 405 detects one or more timestamps of the PWM signal corresponding to one or more of, each rising edge and each falling edge of the PWM signal. The one or more timestamps are detected at the second sample rate. A timestamp corresponds to one of a rising edge and a falling edge of the PWM signal. One or more timestamps detected by the timestamp detector 405 may be in terms a time period of the first sample rate with respect to phase, since the PWM signal is at the first sample rate. Therefore, the timestamp detector 405 may apply an incremental phase correction to the one or more timestamps to represent the one or more timestamps in terms of time period of the second sample rate. The incremental phase correction is based on time period of the first sample rate and time period of the second sample rate.

The timestamp detector 405 may not apply an incremental phase correction in a scenario when ratio of the first sample rate and the second sample rate is an integer. Since in this scenario the first sample rate and the second sample rate have zero phase difference, no incremental phase correction is required, unless one or more of the first sample rate and the second sample rate vary and the ratio of the first sample rate to the second sample rate becomes a non integer.

After applying the incremental phase correction, the one or more timestamps may still be in terms of the time period of the first sample rate. Therefore, the timestamp detector 405 may express the one or more timestamps in terms of time period of the second sample rate based on a gain factor. The gain factor, in turn, is based on ratio of time period of the first sample rate and time period of the second sample rate. As an example, the gain factor may be equal to a ratio of the time period of the QCLK to a multiple of the time period of the RCLK. In another embodiment of the invention, the timestamp detector 405 expresses the one or more timestamps in terms of time period of the second sample rate before applying an incremental phase correction to the one or more timestamps.

Thereafter, the one or more timestamps from the timestamp detector 405 are converted into a plurality of pre-filter signals. The one or more timestamps are converted based on one or more translation factors of a plurality of translation factors by the translator 410-1, the translator 410-2, the translator 410-3 and the translator 410-4. The conversion of the one or more timestamps is performed at the second sample rate, by the plurality of translators. One or more of the plurality of translation factors may be exponential translation factors.

In an embodiment of the invention, each of timestamps corresponding to rising edges of the PWM signal and the timestamps corresponding to falling edges of the PWM signal may be processed using each of the translator 410-1, the translator 410-2, the translator 410-3 and the translator 410-4. For instance, referring to FIG. 4A, each of timestamps corresponding to rising edges of the PWM signal and timestamps corresponding to falling edges of the PWM signal are processed by the translator 410-1. Alternatively, in another embodiment of the invention, each of timestamps corresponding to rising edges of the PWM signal and timestamps corresponding to falling edges of the PWM signal may be processed using separate translators. As illustrated in FIG. 4B, timestamps corresponding to rising edges of the PWM signal are processed by the translator 410-1 and timestamps corresponding to falling edges of the PWM signal are processed by the translator 410-2.

A rising edge and a falling edge of the PWM signal have a sign difference in signal processing. Consequently, a sign of each pre-filter signal of the plurality of pre-filter signals corresponding to each falling edge of the PWM signal is changed by a translator. Referring to FIG. 4A, each of the translator 410-1, the translator 410-2, the translator 410-3 and the translator 410-4 changes a sign of the pre-filter signal corresponding to each falling edge of the PWM signal. Alternatively, if timestamps corresponding to rising edges of the PWM signal and timestamps corresponding to falling edges are processed using separate translators, the sign of pre-filter signal corresponding to falling edge is changed by a corresponding translator. Referring to FIG. 4B, each of the translator 410-2 and the translator 410-4 changes a sign of the pre-filter signal corresponding to falling edge of the PWM signal. Thereafter, the pre-filter signals from each of the translator 410-1 and the translator 410-2 are added.

In each of embodiment corresponding to FIG. 4A and embodiment corresponding to FIG. 4B, after converting the one or more timestamps, the plurality of pre-filter signals is filtered at the second sample rate using the IIR filter 415-1, the IIR filter 415-2, the IIR filter 415-3 and the IIR filter 420-4. Each IIR filter corresponds to one or more translation factors of the plurality of translation factors. As an example, a pre-filter signal generated by converting timestamps based on a first translation factor is filtered using an IIR filter corresponding to the first translation factor. The filtering results in a plurality of intermediate decimated PCM signals. Thereafter, the plurality of intermediate decimated PCM signals is combined by the combiner 420 to produce a PCM signal at the second sample rate.

Figure 5:
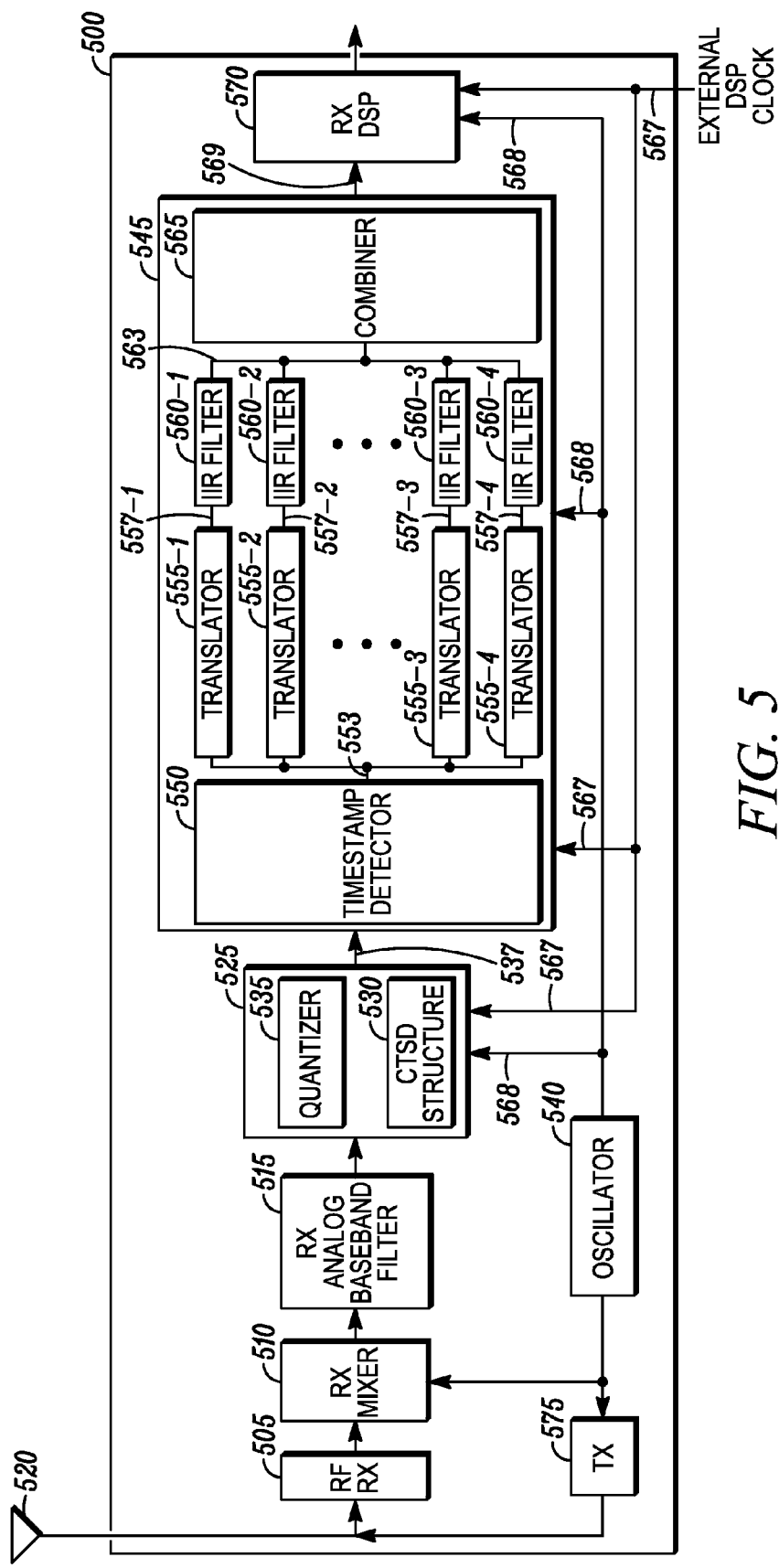
FIG. 5 illustrates a block diagram of a transceiver in accordance with an exemplary embodiment of the invention.

Referring now to FIG. 5, a transceiver 500 in accordance with an exemplary embodiment of the invention is shown. The transceiver 500 includes a receiver 505, a mixer 510 and an analog baseband filter 515. During the reception mode of the transceiver 500, the RF receiver 505 receives a high frequency signal as input from an antenna 520. The high frequency signal is actually an analog signal riding on a high frequency carrier wave. Thereafter, the high frequency signal is demodulated by the mixer 510 and the analog baseband filter 515 for converting the high frequency signal into an analog signal at a lower frequency. The lower frequency may be an intermediate frequency or a baseband frequency. This separates usable information from the high frequency signal in form of the analog signal at a lower frequency.

Thereafter, the analog signal is converted into a digital signal using a PWM ADC 525. The PWM ADC includes a Continuous Time Sigma Delta (CTSD) structure 530 and a quantizer 535. The CTSD structure 530 converts the analog signal into a PWM signal 537 which is further quantized by the quantizer 535. The quantizer 535 can use an oscillator 540 as the QCLK for quantizing the PWM signal 537. Similarly, the quantizer 535 may use an external DSP clock as the RCLK. The PWM signal 537 is then decimated using a decimator 545, formed in accordance with the embodiments of the invention.

The decimator 545 includes a timestamp detector 550, a plurality of translators 555-$n$, a plurality of IIR filters 560-$n$ and a combiner 565. As illustrated in the FIG. 5, the plurality of translators 555-$n$ includes a translator 555-1, a translator 555-2, a translator 555-3 and a translator 555-4. Also, the plurality of IIR filters 560-$n$ includes an IIR filter 560-1, an IIR filter 560-2, an IIR filter 560-3 and an IIR filter 560-4.

The timestamp detector 550 detects one or more timestamps of the PWM signal 537 generated by the PWM ADC 525 at a first sample rate 567. The one or more timestamps are detected at a second sample rate 568. The timestamp detector 550 may express the one or more timestamps in terms of time period of the second sample rate 568 based on a gain factor, as previously described and output as one or more timestamps 553.

After expressing, the timestamp detector 550 may apply an incremental phase correction to the one or more timestamps 553 to represent the one or more timestamps 553 in terms of time period of the second sample rate 568. The incremental phase correction is based on time period of the first sample rate 567 and time period of the second sample rate 568, and the integer or non integer relation thereof.

Thereafter, each of the translator 555-1, the translator 555-2, the translator 555-3 and the translator 555-4, converts the one or more timestamps 553 from the timestamp detector 550 into a plurality of pre-filter signals 557-$n$ based on one or more translation factors of the plurality of translation factors. As illustrated in the FIG. 5, the plurality of pre-filter signals 557-$n$ includes a pre-filter signal 557-1, a pre-filter signal 557-2, a pre-filter signal 557-3 and a pre-filter signal 557-4. The conversion of the one or more timestamps 553 is performed at the second sample rate 568, by the plurality of translators 555-$n$. In an embodiment of the invention, a sign of one or more pre-filter signals of the plurality of pre-filter signals is changed corresponding to each falling edge of the PWM signal 537, by each of the translator 555-1, the translator 555-2, the translator 555-3 and the translator 555-3.

Thereafter, the plurality of pre-filter signals 557-$n$ is filtered at the second sample rate 568 using each of the IIR filter 560-1, the IIR filter 560-2, the IIR filter 560-3 and the IIR filter 560-4. Each IIR filter corresponds to one or more translation factors of the plurality of translation factors. The filtering results in a plurality of intermediate decimated PCM signals 563. The plurality of intermediate decimated PCM signals 563 is combined by the combiner 565 to produce a PCM signal 569 at the second sample rate 568.

In an embodiment of the invention, the decimator 545 can use the oscillator 540 for implementing the first sample rate 567, which is equal to the QCLK for this case. Similarly, the external DSP clock can be used by the decimator 545 for implementing the second sample rate 568, which is equal to the RCLK for the embodiment. The PCM signal is further processed by a digital signal processor 570. Further, during transmission mode of the transceiver 500, a transmitter 575 may transmit signals using the antenna 520.

Various embodiments of the invention provide method and system for decimating a PWM signal. The invention reduces the complexity of a signal processing system by providing a simple, less complex method for decimating the PWM signal. The method of invention facilitates decimating of the PWM signal when QCLK and RCLK are not in an integer relationship. Further, the method is able to decimate the PWM signal even if the QCLK and the RCLK instantaneously vary. The method does not require multiple decimators for decimation, and implements an IIR based decimation while running circuits at a lower sample rate, thereby providing significant advantages over pre-existing systems.

What is claimed is:

1. A method of decimating a Pulse Width Modulated (PWM) signal, the method comprising:
computing at least one timestamp of the PWM signal, the PWM signal being at a first sample rate, the at least one timestamp being computed at a second sample rate, wherein the first sample rate is higher than the second sample rate;
generating a plurality of pre-filter signals based on each of the at least one timestamp and a plurality of translation factors, a pre-filter signal being generated at the second sample rate having a frequency based on the second sample rate;
filtering the plurality of pre-filter signals at the second sample rate using a plurality of Infinite Impulse Response (IIR) filters, each IIR filter corresponding to at least one translation factor of the plurality of translation factors, resulting in a plurality of intermediate decimated PCM signals; and
combining the plurality of intermediate decimated PCM signals to produce a Pulse Code Modulated (PCM) signal the PCM signal being at the second sample rate.

2. The method of claim 1, wherein the PWM signal is generated by a PWM Analog-to-Digital Converter.

3. A method of decimating a Pulse Width Modulated (PWM) signal, the method comprising:
computing at least one timestamp of the PWM signal, the PWM signal being at a first sample rate, the at least one timestamp being computed at a second sample rate, wherein the first sample rate is higher than the second sample rate;
generating a plurality of pre-filter signals based on each of the at least one timestamp and a plurality of translation factors, a pre-filter signal being generated at the second sample rate having a frequency based on the second sample rate;
filtering the plurality of pre-filter signals at the second sample rate using a plurality of Infinite Impulse Response (IIR) filters, each IIR filter corresponding to at least one translation factor of the plurality of translation factors, resulting in a plurality of intermediate decimated PCM signals; and
wherein the computing step comprises:
detecting at least one timestamp corresponding to at least one of each rising edge and each falling edge of the PWM signal; and
applying an incremental phase correction to the at least one timestamp, wherein the incremental phase is based on a time period of the first sample rate and a time period of the second sample rate.

4. The method of claim 3, wherein the applying step comprises:
expressing the at least one timestamp in terms of the time period of the second sample rate based on a gain factor in response to applying an incremental phase correction, the gain factor being based on a ratio of the time period of the first sample rate and the time period of the second sample rate.

5. A method of decimating a Pulse Width Modulated (PWM) signal, the method comprising:
computing at least one timestamp of the PWM signal, the PWM signal being at a first sample rate, the at least one timestamp being computed at a second sample rate, wherein the first sample rate is higher than the second sample rate;
generating a plurality of pre-filter signals based on each of the at least one timestamp and a plurality of translation factors, a pre-filter signal being generated at the second sample rate having a frequency based on the second sample rate;
filtering the plurality of pre-filter signals at the second sample rate using a plurality of Infinite Impulse Response (IIR) filters, each IIR filter corresponding to at least one translation factor of the plurality of translation factors, resulting in a plurality of intermediate decimated PCM signals; and
wherein the generating step comprises:
converting the at least one timestamp into a pre-filter signal based on at least one translation factor belonging to the plurality of translation factors; and
changing a sign of the pre-filter signal corresponding to at least one falling edge of the PWM signal.

6. The method of claim 5, wherein the plurality of translation factors are based on a ratio of the first sample rate and the second sample rate.

7. The method of claim 6, wherein at least one translation factor of the plurality of translation factors is an exponential translation factor.

8. A method of decimating a Pulse Width Modulated (PWM) signal, the method comprising:
computing at least one timestamp of the PWM signal, the PWM signal being at a first sample rate, the at least one timestamp being computed at a second sample rate, wherein the first sample rate is higher than the second sample rate;
generating a plurality of pre-filter signals based on each of the at least one timestamp and a plurality of translation factors, a pre-filter signal being generated at the second sample rate having a frequency based on the second sample rate;
filtering the plurality of pre-filter signals at the second sample rate using a plurality of Infinite Impulse Response (IIR) filters, each IIR filter corresponding to at least one translation factor of the plurality of translation factors, resulting in a plurality of intermediate decimated PCM signals; and
wherein at least one IIR filter of the plurality of IIR filters is limited to unique poles.

9. A system for decimating a Pulse Width Modulated (PWM) signal, the system comprising:
a timestamp detector for computing at least one timestamp of the PWM signal, the PWM signal being at a first sample rate, the at least one timestamp being computed at a second sample rate, wherein the first sample rate is higher than the second sample rate;
a plurality of translators for generating a plurality of pre-filter signals based on each of the at least one timestamp and a plurality of translation factors, a pre-filter signal being generated at the second sample rate;
a plurality of IIR filters for filtering the plurality of pre-filter signals at the second sample rate, each IIR filter corresponding to at least one translation factor of the plurality of translation factors, the filtering resulting in a plurality of intermediate decimated PCM signals; and a combiner for combining the plurality of intermediate decimated PCM signals to produce a PCM signal, the PCM signal being at the second sample rate.

10. The system of claim 9, wherein the timestamp detector detects at least one timestamp corresponding to at least one of each rising edge and each falling edge of the PWM signal; and applies an incremental phase correction to the at least one timestamp, wherein the incremental phase is based on a time period of the first sample rate and a time period of the second sample rate.

11. The system of claim 10, wherein the timestamp detector expresses the at least one timestamp in terms of the time period of the second sample rate based on a gain factor in response to applying an incremental phase correction, the gain factor being based on a ratio of the time period of the first sample rate and the time period of the second sample rate.

12. The system of claim 9, wherein a translator of the plurality of translators converts the at least one timestamp into a pre-filter signal based on at least one translation factor belonging to the plurality of translation factors; and changes a sign of the pre-filter signal corresponding to at least one falling edge of the PWM signal.

13. A transceiver comprising:
a timestamp detector for computing at least one timestamp of the PWM signal, the PWM signal being at a first sample rate, the at least one timestamp being computed at a second sample rate, wherein the first sample rate is higher than the second sample rate;
a plurality of translators for generating a plurality of pre-filter signals based on each of the at least one timestamp and a plurality of translation factors, a pre-filter signal being generated at the second sample rate;
a plurality of IIR filters for filtering the plurality of pre-filter signals at the second sample rate, each IIR filter corresponding to at least one translation factor of the plurality of translation factors, the filtering results in a plurality of intermediate decimated PCM signals; and
a combiner for combining the plurality of intermediate decimated PCM signals to produce a PCM signal, the PCM signal being at the second sample rate.

14. The transceiver of claim 13, wherein the timestamp detector detects at least one timestamp corresponding to at least one of each rising edge and each falling edge of the PWM signal; and expresses the at least one timestamp in terms of the time period of the second sample rate based on a gain factor of the detected at least one timestamp, the gain factor being based on a ratio of the time period of the first sample rate and the time period of the second sample rate.

15. The transceiver of claim 14, wherein the timestamp detector applies an incremental phase correction to the at least one timestamp in response to expressing the least one timestamp in terms of the time period of the second sample rate, wherein the incremental phase is based on a time period of the first sample rate and a time period of the second sample rate.

16. The transceiver of claim 13, wherein a translator of the plurality of translators converts the at least one timestamp into a pre-filter signal based on at least one translation factor belonging to the plurality of translation factors; and changes a sign of the pre-filter signal corresponding to at least one falling edge of the PWM signal.

17. The transceiver of claim 13 further comprising:
a quantizer; and
a Continuous Time Sigma Delta (CTSD) structure for generating the PWM signal, wherein the CTSD structure is adaptively coupled to the quantizer.

18. The transceiver of claim 15, wherein a ratio of the first sample rate and the second sample rate is a non integer.

19. The transceiver of claim 15, wherein the incremental phase correction is not applied by the timestamp detector when a ratio of the first sample rate and the second sample rate is an integer.

\* \* \* \* \*